(12) United States Patent
Kantarovsky et al.

(10) Patent No.: US 12,550,410 B2
(45) Date of Patent: Feb. 10, 2026

(54) HIGH ELECTRON MOBILITY TRANSISTORS

(71) Applicant: GlobalFoundries U.S. Inc., Malta, NY (US)

(72) Inventors: Johnatan A. Kantarovsky, South Burlington, VT (US); Rebouh Benelbar, Murphy, TX (US); Ajay Raman, Essex Junction, VT (US); Michel J. Abou-Khalil, Essex-Junction, VT (US); Rajendran Krishnasamy, Essex Junction, VT (US); Randy L Wolf, Essex Junction, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 635 days.

(21) Appl. No.: 17/943,925

(22) Filed: Sep. 13, 2022

(65) Prior Publication Data
US 2024/0088242 A1    Mar. 14, 2024

(51) Int. Cl.
| H10D 64/23 | (2025.01) |
| H10D 30/01 | (2025.01) |
| H10D 30/47 | (2025.01) |
| H10D 62/824 | (2025.01) |
| H10D 62/85 | (2025.01) |
| H10D 64/01 | (2025.01) |

(52) U.S. Cl.
CPC ......... *H10D 64/258* (2025.01); *H10D 30/015* (2025.01); *H10D 30/475* (2025.01);
(Continued)

(58) Field of Classification Search
CPC ............... H10D 64/258; H10D 64/256; H10D 62/8503; H10D 62/115; H10D 62/824; H10D 64/257; H10D 30/475; H10D 64/01; H10D 62/53; H10D 30/015; H10D 84/08; H10D 84/01; H10D 88/101; H10D 84/811; H10D 84/05; H10D 30/675; H10D 30/6738; H10D 64/62; H01L 23/66; H01L 24/13; H01L 24/16; H01L 21/76898; H01L 25/16; H01L 21/6835; H01L 23/4824; H01L 24/73; H01L 23/498; H01L 23/5223; H01L 21/28264; H01L 23/53238; H01L 21/28581; H01L 23/485; H01L 21/28575; H01L 23/5226; H01L 2924/19107; H01L 2224/94; H01L 2224/0401;
(Continued)

(56) References Cited

U.S. PATENT DOCUMENTS

| 7,601,993 B2 | 10/2009 | Hoshi et al. |
| 8,742,460 B2 | 6/2014 | Mishra et al. |

(Continued)

*Primary Examiner* — Mouloucoulaye Inoussa
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to high-electron-mobility transistors and methods of manufacture. A structure includes: a semiconductor layer on a semiconductor material; a gate structure on the semiconductor layer; a drain region comprising the semiconductor layer and which is adjacent to the gate structure; an ohmic contact which includes at least one terminal connection connecting to the semiconductor material, the ohmic contact being adjacent to the drain region and spaced away from the gate structure; and a capacitance reducing structure adjacent to the drain region.

20 Claims, 7 Drawing Sheets

(52) U.S. Cl.
CPC ....... *H10D 62/824* (2025.01); *H10D 62/8503* (2025.01); *H10D 64/01* (2025.01)

(58) Field of Classification Search
CPC ..... H01L 2224/131; H01L 2224/48177; H01L 2924/1421; H01L 2224/05657; H01L 2224/48247; H01L 2224/16227; H01L 2924/10156; H01L 2224/05647; H01L 2224/05025; H01L 2224/73257; H01L 2924/013; H01L 2924/00014; H01L 2224/05644
See application file for complete search history.

(56) References Cited

U.S. PATENT DOCUMENTS

| | | |
|---|---|---|
| 9,362,398 B2 | 6/2016 | Pendharkar |
| 9,842,923 B2 | 12/2017 | Banerjee et al. |
| 11,139,290 B2 | 10/2021 | Lin et al. |
| 11,450,670 B1* | 9/2022 | Lee ........................ H10B 12/03 |
| 2011/0233559 A1* | 9/2011 | Ishikura ............... H10D 62/126 257/E29.242 |
| 2013/0146983 A1* | 6/2013 | Park ..................... H10D 30/015 257/E21.409 |
| 2017/0229367 A1* | 8/2017 | Ge ........................ H10D 86/01 |
| 2019/0115430 A1* | 4/2019 | Tsubomi ............... H10D 62/10 |
| 2019/0172930 A1 | 6/2019 | Pendharkar et al. |
| 2019/0237552 A1* | 8/2019 | LaRoche ........... H01L 21/28264 |
| 2020/0321456 A1 | 10/2020 | Bramanti et al. |
| 2021/0299121 A1* | 9/2021 | Shah ..................... A61K 47/38 |
| 2021/0375856 A1* | 12/2021 | Alcorn ................... H10D 84/08 |
| 2022/0037482 A1 | 2/2022 | Kantarovsky et al. |
| 2022/0254902 A1* | 8/2022 | Okita ................ H10D 62/8503 |
| 2023/0238446 A1* | 7/2023 | Cheng ................ H10D 62/8503 257/183 |

\* cited by examiner

HIGH ELECTRON MOBILITY TRANSISTORS

BACKGROUND

The present disclosure relates to semiconductor structures and, more particularly, to high-electron-mobility transistors and methods of manufacture.

A high-electron-mobility transistor (HEMT) is a field-effect transistor incorporating a junction between two materials with different band gaps (i.e. a heterojunction) as the channel instead of a doped region (as is generally the case for a MOSFET). Commonly used material combinations are GaN or GaAs, although other materials can be used dependent on the application of the device.

HEMT transistors are able to operate at higher frequencies than ordinary transistors, up to millimeter wave frequencies, and are used in high-frequency products such as cell phones, satellite television receivers, voltage converters, and radar equipment. For example, a HEMT may be used in satellite receivers and in low power amplifiers.

Power amplifier High Electron Mobility Transistors (HEMTs) generate a large amount of heat that degrades electrical and reliability performance. The heat is generated under the gate, and relatively close adjacent gates can cause the entire device to heat up, which degrades the electrical performance and poses a reliability risk. Increasing the gate-to-gate pitch improves the heat dissipation but at the cost of increasing the output capacitance, which degrades the Ft/Fmax figure of merit.

SUMMARY

In an aspect of the disclosure, a structure comprises: a semiconductor layer on a semiconductor material; a gate structure on the semiconductor layer; a drain region comprising the semiconductor layer and which is adjacent to the gate structure; an ohmic contact which includes at least one terminal connection connecting to the semiconductor material, the ohmic contact being adjacent to the drain region and spaced away from the gate structure; and a capacitance reducing structure adjacent to the drain region.

In an aspect of the disclosure, a structure comprises: a semiconductor layer on a semiconductor material; a gate structure on the semiconductor layer; a drain region adjacent to the gate structure, an ohmic contact comprising at least one terminal connection connecting to the semiconductor material; and an isolation structure in the semiconductor material and under the ohmic contact.

In an aspect of the disclosure, a method comprises: forming a semiconductor layer on a semiconductor material; forming a gate structure on the semiconductor layer; forming a drain region in the semiconductor layer and adjacent to the gate structure; forming an ohmic contact comprising at least one terminal connection connecting to the semiconductor material, the ohmic contact being adjacent to the drain region and spaced away from the gate structure; and forming a capacitance reducing structure adjacent to the contact.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high-electron-mobility transistors (HEMT) and methods of manufacture. More specifically, the present disclosure relates to a HEMT device with a partially blocked drain ohmic contact. For example, the ohmic contact may include a gap or open space or defective region. Advantageously, the present disclosure provides a HEMT device with a reduced drain capacitance (Cout).

The HEMT of the present disclosure can be manufactured in a number of ways using a number of different tools. In general, though, the methodologies and tools are used to form structures with dimensions in the micrometer and nanometer scale. The methodologies, i.e., technologies, employed to manufacture the HEMT of the present disclosure have been adopted from integrated circuit (IC) technology. For example, the structures are built on wafers and are realized in films of material patterned by photolithographic processes on the top of a wafer. In particular, the fabrication of the HEMT uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
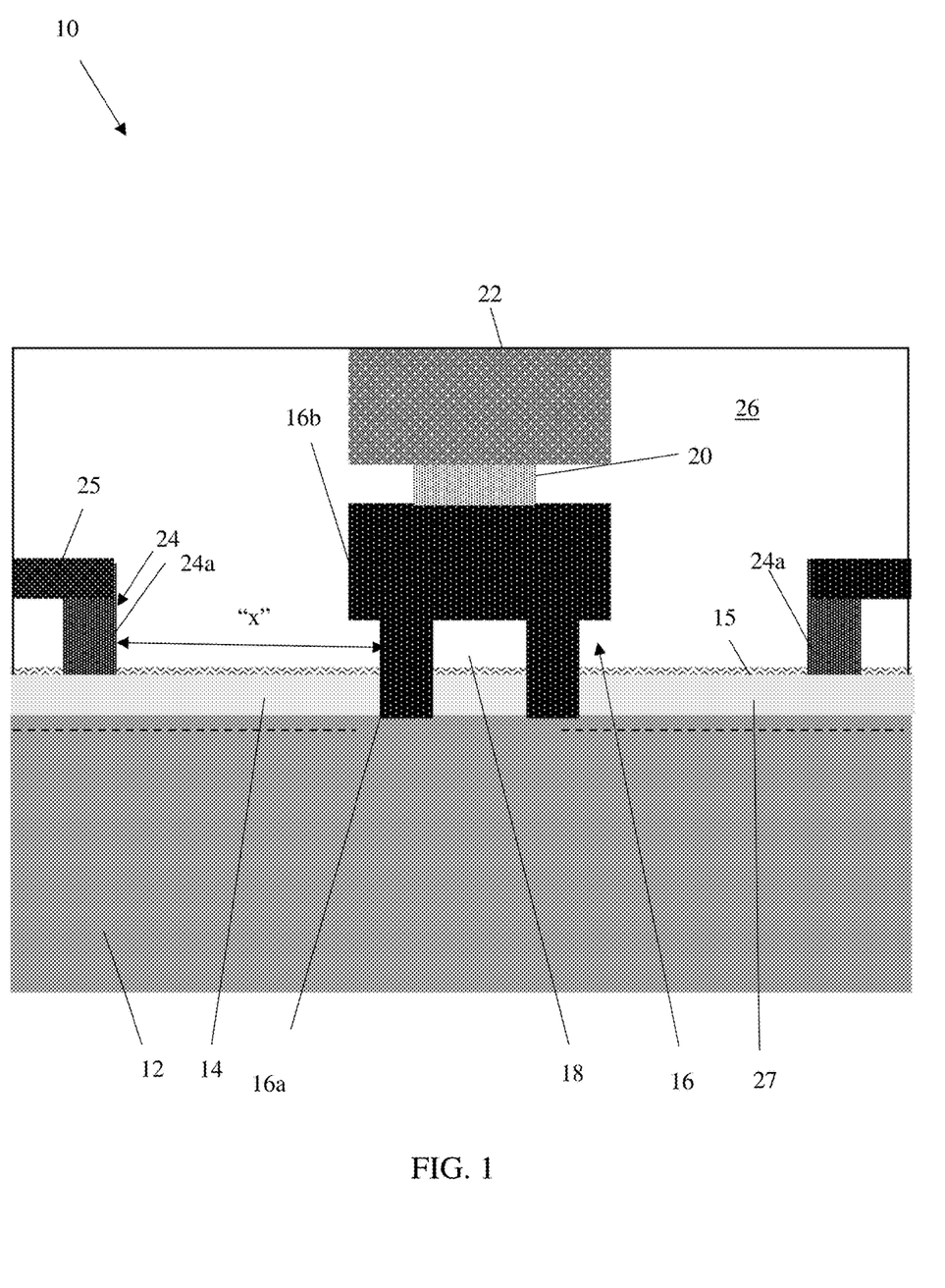
FIG. 1 shows a device with an ohmic contact gap and methods of fabrication in accordance with aspects of the present disclosure.

FIG. 1 shows a device with an ohmic contact gap in accordance with aspects of the present disclosure. In particular, the device 10 may be a HEMT device and, more particularly, a III-IV HEMT device. In the device 10 may also be representative of a vertical FET, bipolar FET or any horizontal device that uses 1 or more 2DEG channels such as MIS-HEMT, MOS-HEMT and etc.

The device 10 includes a substrate 12 composed of, for example, GaN, and a semiconductor layer 14 composed of, for example, AlGaN. It should be recognized by one of skill in the art that, in embodiments, a GaN layer may be grown on a handle substrate (not shown), e.g., Si or SoC, followed by transition layers, e.g., buffer layers. The substrate 12, e.g., active region, may be provided on the buffer layers. The buffer layers may be used to compensate for lattice and thermal mismatch between the handle substrate and the active region. It should also be understood by those of ordinary skill in the art that the substrate 12 and the semiconductor layer 14 may be composed of other materials such as semiconductor materials with different band gaps. For example, the substrate 12 may include any III-V compound semiconductors, such as gallium arsenide (GaAs), gallium nitride (GaN), or II-VI compound semiconductors such as zinc selenide (ZnSe). In each of the embodiments, the dashed line below the interface of the substrate 12 and the semiconductor layer 14 may be representative of two-dimensional electron gas (2DEG).

Still referring to FIG. 1, an etch stop layer 15 may be formed on the semiconductor layer 14. In alternative embodiments, the etch stop layer 15 may be formed under the semiconductor layer 14. The etch stop layer 15 may be SiN as an example.

An ohmic contact 16 may be in contact with the substrate 12 and semiconductor layer 14, extending through the semiconductor layer 14 and etch stop layer 15. Multiple fingers 24a of a gate structure 24 are electrically coupled to one another and may be on sides of (or surrounding) the ohmic contact 16. As should be understood by one of ordinary skill in the art, the gate structure 24 may be a multi-finger gate structure with drain regions 27 associated with each finger 24a adjacent to the ohmic contact 16. The drain regions 27 may be maintained at a desired gate to drain distance "x".

In embodiments, the ohmic contact 16 may be composed of an ohmic contact material such as Ti/Al/TiN, Ti or Au; although other ohmic contact materials are also contemplated herein. In embodiments, the ohmic contact 16 includes a body contact portion 16b and multiple terminal connections 16a connecting directly to the semiconductor layer 14 and the substrate 12. The terminal connections 16a comprise a volume smaller than the contact body portion 16, which connects to the multiple terminal connections 16a. Moreover, the use of the terminal connections 16a and the contact body portion 16 comprise a volume smaller than a larger, single monolithic contact structure. And a combination of the smaller volumed multiple terminal connections 16a and the dielectric material 18, e.g., ohmic contact gap, comprise a capacitance reducing structure, which effectively reduces the capacitance at the drain 27 (Cout). That is, the smaller, spaced apart terminal connections 16a (e.g., with the dielectric filled gap 18) lower the capacitance capability of the contact 16 and, hence, reduces the capacitance at the drain 27 (Cout) of the multiple fingers 24a. The dielectric material 26 in the center of the contact 16 may be a partial isolation block.

In embodiments, the terminal connections 16a may be of different widths and/or different spacings of the gap 18 therebetween, depending on the gate to gate pitch and/or desired device performance. For example, the width of the terminal connections 16a may be about 4 to 10 microns, with a gate pitch of about 30 microns. The gap 18 between the terminal connections 16a may be 5 microns. It should be understood by one of ordinary skill in the art that the above dimensions are merely exemplary and that other dimensions are also contemplated herein.

In FIG. 1, gate contacts 25 electrically connect to the multiple fingers 24a of the gate structure 24 as is known in the art. Also, in embodiments, a via contact 20 and wiring layer 22 may be in electrical contact with the ohmic contact 16. In embodiments, the via contact 20 may be tungsten as an example, in direct contact with the body contact portion 16b of the ohmic contact 16. The wiring layer 22 may be copper or aluminum as examples. An interlevel dielectric material 26 may be provided over and surrounding the structures, e.g., contact 16, via contact 20, gate contacts 25, wiring layer 22 and gate structure 24. Also, as should be understood by one of ordinary skill in the art when reading the present disclosure, the interlevel dielectric material 26 will be provided within the gap 18 between the terminal connections 16a. In embodiments, the interlevel dielectric material 26 may be any known dielectric material including, for example, layers of oxide and nitride.

Figure 2:
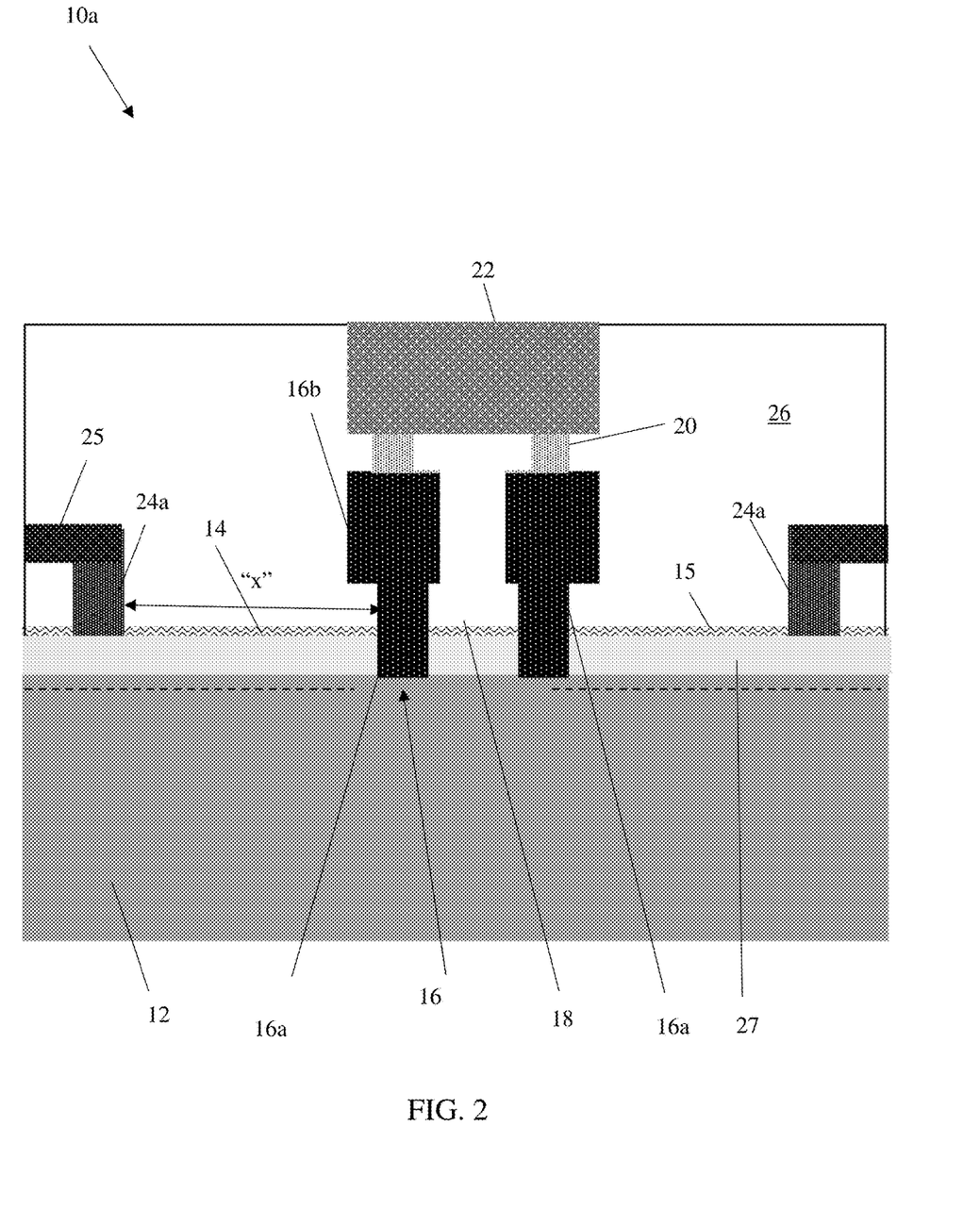
FIG. 2 shows a device with an ohmic contact gap in accordance with additional aspects of the present disclosure.

FIG. 2 shows a device with an ohmic contact gap in accordance with additional aspects of the present disclosure. In the device 10a of FIG. 2, two contacts 16 are shown in contact with the substrate 12, with the multiple fingers 24a of the gate structure 24 on outer sides of each of the ohmic contacts 16. In embodiments, each of the ohmic contacts 16 include the terminal connection 16a and the body contact portion 16b. In embodiments, via contacts 20 may be in contact with the respective body contact portions 16b. A single wiring layer 22 may be in contact with the via contacts 20.

In this embodiment, each of the contacts 16, i.e., the terminal connections 16a and the body contact portions 16a of each contact 16, are separated from one another by the dielectric material 26, resulting in the gap or space 18. Also, in this embodiment, the volume of material of the terminal connection 16a and the body contact portion 16b may be reduced (less) compared to a single, larger monolithic structure in conventional devices. The reduced volume results in a reduced capacitance of the contacts 16 which, in turn, provides a reduced a drain capacitance, Cout. The terminal connection 16a and the body contact portion 16b to further reduce the capacitance at the drain 27 (Cout). The remaining features of the device 10a may be similar to the device 10 of FIG. 1.

Figure 3:
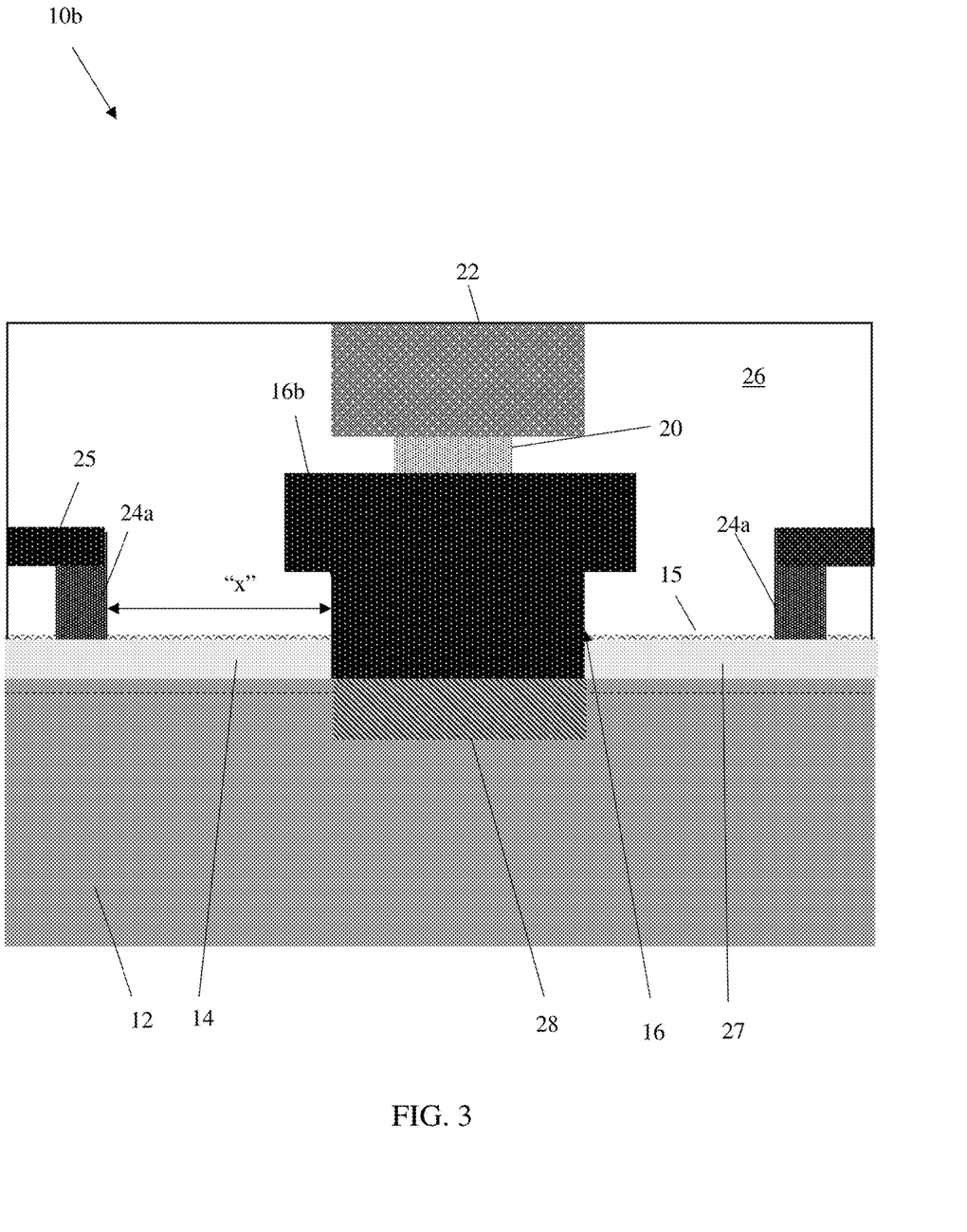
FIG. 3 shows a device with an ohmic contact gap and methods of fabrication in accordance with additional aspects of the present disclosure.

FIG. 3 shows a device with an ohmic contact gap in accordance with additional aspects of the present disclosure. In the device 10b of FIG. 3, the ohmic contact gap is a defective region 28 in the substrate 12 below the ohmic contact 16. In embodiments, the defective region 28 is an isolation region which causes a discontinuity in the substrate 12. Also, in this embodiment, the ohmic contact 16 may be a monolithic structure as the defective region 28 will be used to effectively lower the drain capacitance, Cout. As should be understood, the defective region 28 may be provided in the device 10 of FIG. 1 or the device 10a of FIG. 2 to further reduce the drain capacitance, Cout. As noted above, in FIG. 3, the dashed line below the interface of the substrate 12 and the semiconductor layer 14 may be representative of two-dimensional electron gas (2DEG). In FIG. 3, the defective region 28 interrupts the 2DEG from being formed. The remaining features of the device 10a may be similar to the device 10 of FIG. 1

The defective region 28 may be, for example, an argon or nitrogen implant in the substrate 12, although other implants of noble or inert gases may be provided into the substrate 12. Other implants may be, e.g., xenon (Xe), arsenic (As), or germanium (Ge) as is known in the art such that no further explanation is required for a complete understanding of the present disclosure. By way of example, the defective region 28 may be provided by an implant process using an inert or noble gas, e.g., an argon implant, followed by a thermal anneal. In one exemplary embodiment, the argon implant process may be provided at a low dose and energy followed by the anneal process. Illustratively and as a non-limiting example, the argon implant can be at a dose of 30 Key to 500 Key, and the energy can be at 1e14 to 1e15. In embodiments, the anneal process can be a spike anneal process and, more specifically, can be performed at a temperature of about 900° C. to about 1100° C. at a pressure of about 1 ATM or above, e.g., in a range from about 1E-9 to about 1E-8 Torr.

Figure 4:
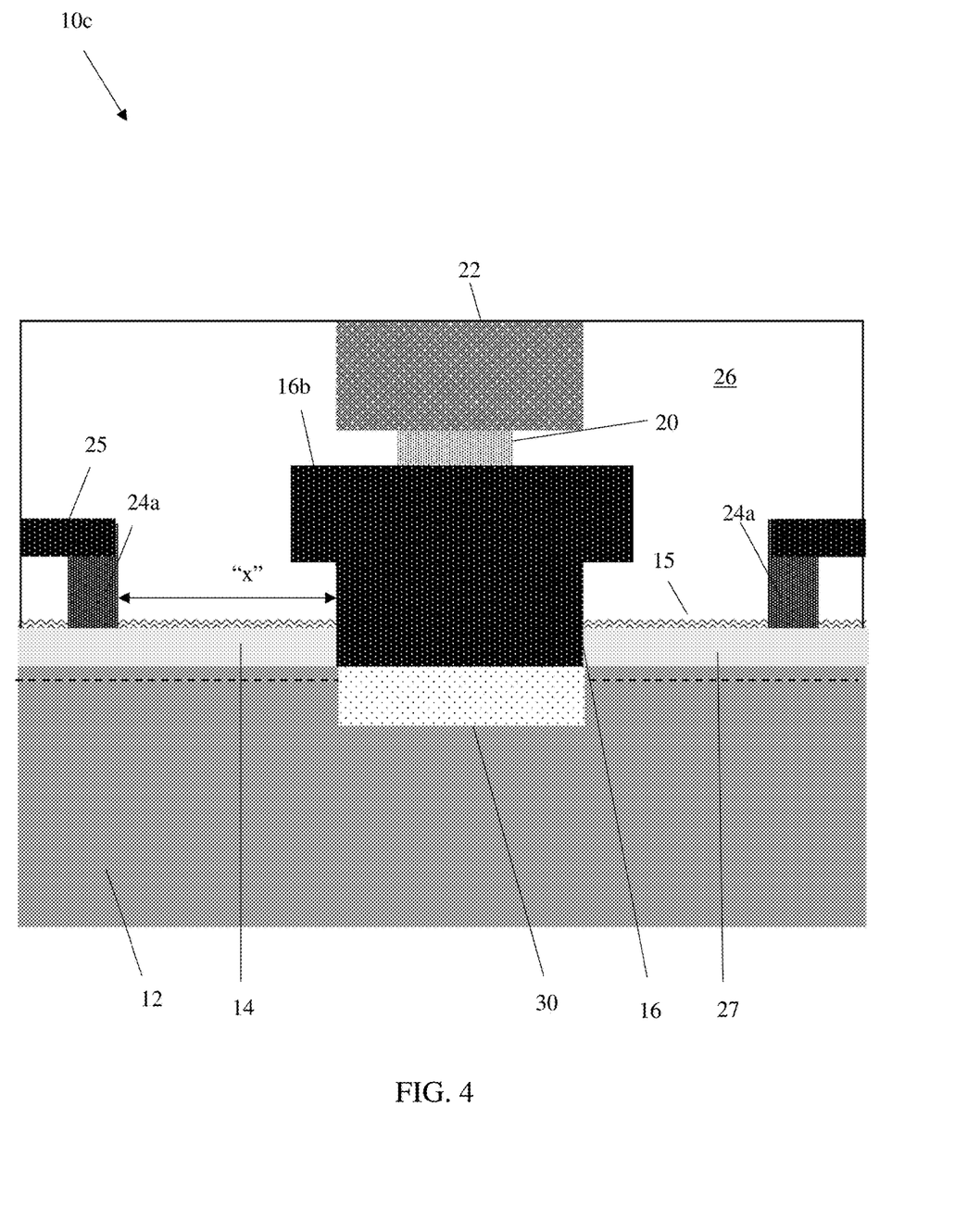
FIG. 4 shows a device with an ohmic contact gap and methods of fabrication in accordance with additional aspects of the present disclosure.

FIG. 4 shows a device with an ohmic contact gap in accordance with additional aspects of the present disclosure. In the device 10c of FIG. 4, the ohmic contact gap is an isolation trench structure 30 provided in the substrate 12 below the contact 16. It should be recognized that the isolation trench structure 30 (e.g., capacitance reducing feature) effectively blocks current flow in the substrate 12 thereby reducing the drain capacitance, Cout. In embodiments, the isolation trench structure 30 may be, for example, a shallow trench isolation structure comprising oxide (e.g., $SiO_2$). It should be recognized that the isolation trench structure 30 may also be provided in the device 10 of FIG. 1 or the device 10*a* of FIG. 2 to further reduce the drain capacitance, Cout. In this embodiment, the contact 16 may be a monolithic structure. The remaining features of the device 10*a* may be similar to the device 10 of FIG. 1.

In embodiments, the isolation trench structure 30 may be provided in the substrate 12. In embodiments, the isolation trench structure 30 may be formed by growing the semiconductor layer 14 and then etching the semiconductor layer 14, while also etching into the substrate 12. In embodiments, the isolation trench structure 30 can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), will be used to transfer the pattern to form one or more trenches in substrate 12 through the openings of the resist. Following the resist removal by a conventional oxygen ashing process or other known stripants, insulator material can be deposited by any conventional deposition processes, e.g., chemical vapor deposition (CVD) processes. Any residual material on the surface of the substrate 12 can be removed by conventional chemical mechanical polishing (CMP) processes.

Figure 5A:
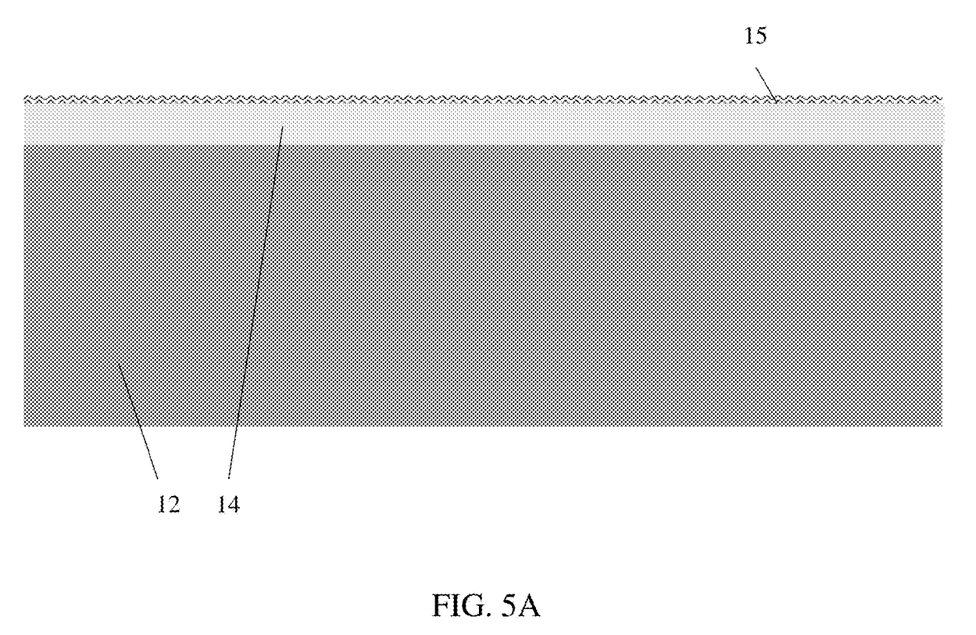
FIGS. 5A-5C show methods of fabricating the device of FIG. 1 in accordance with aspects of the present disclosure.
Figure 5B:
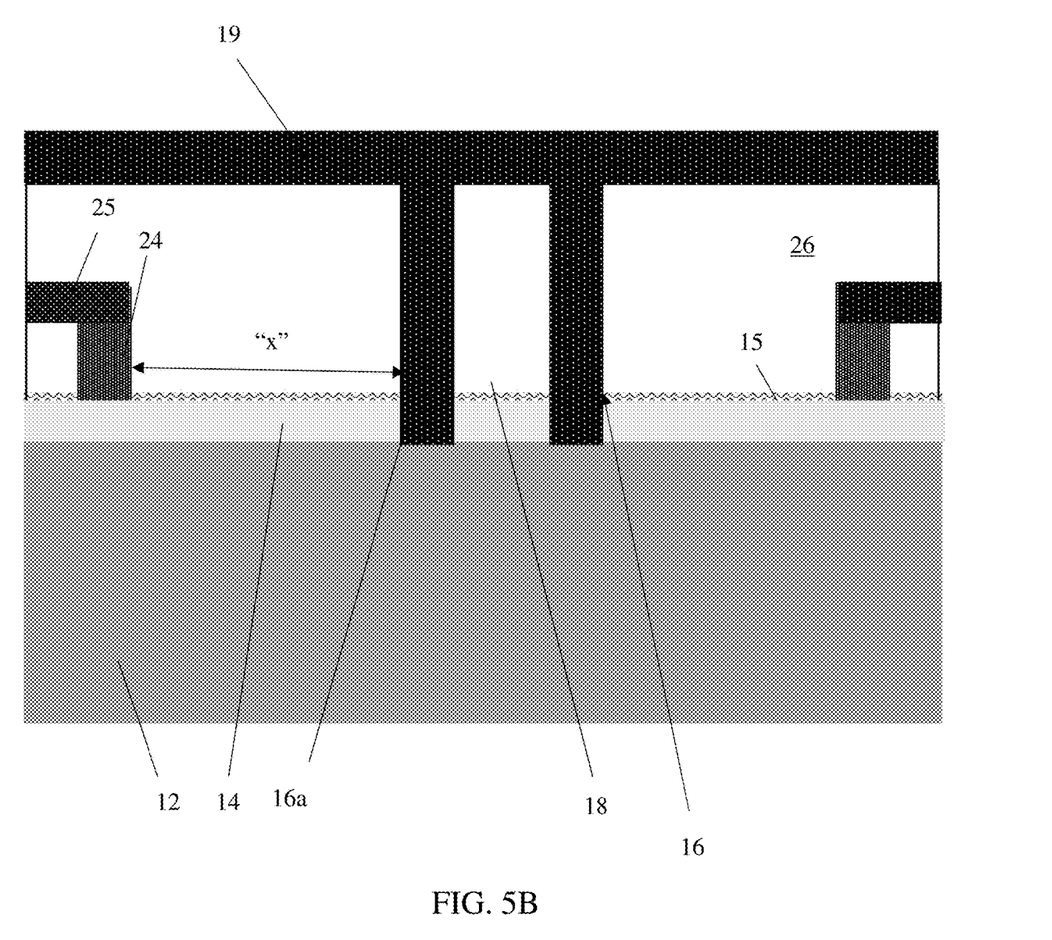
Figure 5C:
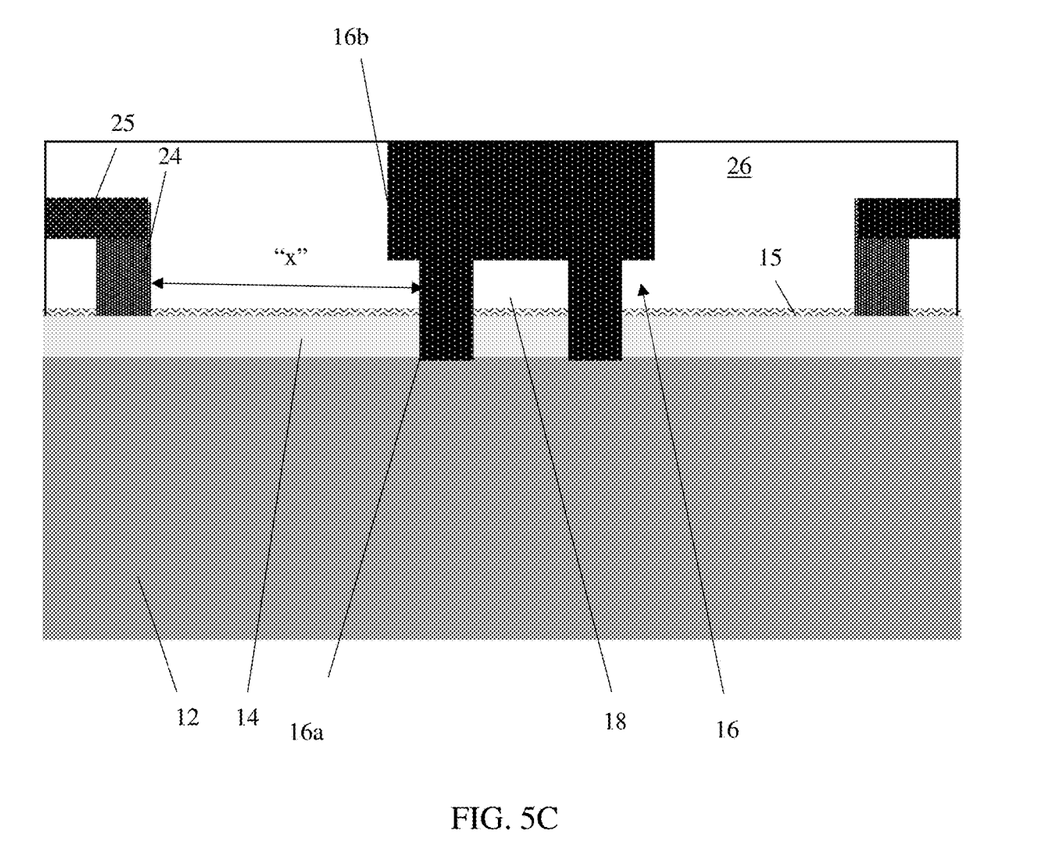

FIGS. 5A-5C show method steps of fabricating the device of FIG. 1 in accordance with aspects of the present disclosure. In particular, FIG. 5A shows the substrate 12, semiconductor layer 14 and etch stop layer 15. In embodiments, the substrate 12 may be formed on a buffer layer and semiconductor wafer (not shown). The substrate 12 may be deposited by any conventional deposition method including, e.g., MOCVD. The semiconductor layer 14 composed of, for example, AlGaN, may be deposited on the substrate 12 using any conventional deposition method including, e.g., MOCVD. The etch stop layer 15 may be deposited on the semiconductor layer 14 using any conventional deposition method including, e.g., CVD.

In FIG. 5B, the gate structure (e.g., multiple fingers) 24 may be formed on the semiconductor layer 14, extending through the etch stop layer 15. Although not critical to the understanding of the present disclosure, the gate structure 24 can be fabricated using conventional CMOS processes. For example, the gate structure 24 can be fabricated by the deposition and patterning of gate material, e.g., gate metal stacks such as Pt/Au or Ni/Au, after forming an opening (using conventional lithography and etching techniques) in the etch stop layer 15 to expose the underlying semiconductor layer 14. In embodiments, the opening may not be required when the etch stop layer 15 is under the semiconductor layer 14.

An insulator material, e.g., dielectric material 26, may be formed over the gate structure 24 using conventional deposition methods, e.g., CVD. The contact 25 may be formed through the dielectric material 26 and contacting to the gate structure 24 by conventional lithography, etching and deposition methods known to those of skill in the art. An additional insulator material, e.g., dielectric material 26, may be formed over the contact 25, and terminal connections 16*a* of the contact 16 may then be formed through the additional dielectric material 26 by lithography, etching and deposition methods known to those of skill in the art. The deposition process may result in ohmic contact material 19 on a top surface of the dielectric material 26.

For example, for the terminal connections 16*a*, a resist formed over the dielectric material 26 is exposed to energy (light) to form a pattern (opening). Etching processes with selective chemistries, e.g., RIE, will be used to transfer the pattern to form trenches in the dielectric material 26, semiconductor layer 14 and etch stop layer 15, thereby exposing the underlying substrate 12. In embodiments, ohmic contact material may be deposited within the trenches, which results in the formation of the gap 18 (comprising dielectric material) between the terminal connections 16*a* of the contact 16. Any residual material on the surface of the dielectric material 26 can be removed by conventional CMP processes. A similar process can be used to form the contacts 25.

In FIG. 5C, the ohmic contact material 19 may be removed by a planarization process (CMP), as an example. The body contact portion 16*b* of the contact 16 may be formed by conventional lithography, etching and deposition methods known to those of skill in the art as described above. In this example, a RIE with selective chemistry will be used to transfer the pattern to form a trench in the additional dielectric material 26 to expose the terminal connections 16*a*, followed by deposition of additional ohmic contact material to form the body contact portion 16*b* in contact with the terminal connections 16*a*. Any residual material on the surface of the dielectric material 26 can be removed by conventional CMP processes.

Referring back to FIG. 1, the via contact 20 and wiring layer 22 may formed in electrical contact with the contact 16. For example, following deposition of additional dielectric material 26, a trench may be formed to expose the body contact portion 16*b* of the contact 16 using conventional lithography and deposition methods as described herein. The material of the via contact 20 may be deposited in the trench to form the via contact 20. A similar method may be used to form the wiring layer 22. Any residual material on the surface of the dielectric material 26 can be removed by conventional CMP processes.

The HEMT can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a semiconductor layer on a semiconductor material;
a gate structure on the semiconductor layer;
a drain region comprising the semiconductor layer and which is adjacent to the gate structure;
an ohmic contact comprising at least one terminal connection in contact with the semiconductor material and the semiconductor layer, the ohmic contact being adjacent to the drain region and spaced away from the gate structure; and
a capacitance reducing structure adjacent to the drain region and in physical contact with an underside surface of the ohmic contact.

2. The structure of claim 1, wherein the capacitance reducing structure comprises an isolation region in the semiconductor material under the ohmic contact.

3. The structure of claim 2, wherein the isolation region comprises a defective region of the semiconductor material under the ohmic contact.

4. The structure of claim 2, wherein the isolation region comprises a shallow trench isolation region in the semiconductor material under the ohmic contact.

5. The structure of claim 2, wherein the ohmic contact comprises a monolithic metal structure with a single terminal connection to the semiconductor material and the semiconductor layer.

6. The structure of claim 2, wherein the ohmic contact comprises multiple terminal connections separated by dielectric material, the multiple terminal connections comprising a volume smaller than a contact body portion connecting to the multiple terminal connections, wherein the dielectric material between the multiple terminal connections comprise an additional capacitance reducing structure.

7. The structure of claim 1, wherein the ohmic contact comprises multiple terminal connections and a single body contact portion, and dielectric material separates the multiple channel connections, the dielectric material comprises the capacitance reducing structure.

8. The structure of claim 7, wherein the semiconductor layer and the semiconductor material comprise different band gaps.

9. The structure of claim 1, wherein the ohmic contact comprises multiple terminal connections and multiple contact body portions, the multiple terminal connections are separated from one another by dielectric material, the multiple contact body portions are separated from one another by the dielectric material and the dielectric material between the multiple terminal connections and multiple contact body portions comprises the capacitance reducing structure.

10. The structure of claim 9, further comprising a single contact via connecting to the multiple terminal connections.

11. A structure comprises:
a semiconductor layer on a semiconductor material;
a gate structure on the semiconductor layer;
a drain region adjacent to the gate structure;
an ohmic contact comprising at least one terminal connection extending through the semiconductor layer and contacting to the semiconductor material; and
an isolation structure in the semiconductor material, under and physically contacting to an underside surface of the ohmic contact.

12. The structure of claim 11, wherein the semiconductor layer comprises a different bandgap than the semiconductor material.

13. The structure of claim 12, wherein the isolation structure comprises a defective region of the semiconductor material under the ohmic contact.

14. The structure of claim 12, wherein the isolation structure comprises a shallow trench isolation region in the semiconductor material under the ohmic contact.

15. The structure of claim 12, wherein the ohmic contact comprises a monolithic metal structure with a single terminal connection to the semiconductor material.

16. The structure of claim 11, wherein the ohmic contact comprises multiple terminal connections separated by dielectric material and connecting to a single contact body portion.

17. The structure of claim 16, further comprising a via contact connecting to the single contact body portion.

18. The structure of claim 11, wherein the ohmic contact comprises multiple terminal connections and multiple body contact portions, separated by dielectric material.

19. The structure of claim 18, further comprising a via contact connecting to the multiple body contact portions.

20. A method comprising:
forming a semiconductor layer on a semiconductor material;
forming a gate structure on the semiconductor layer;
forming a drain region in the semiconductor layer and adjacent to the gate structure;
forming an ohmic contact comprising at least one terminal connection in contact with the semiconductor material and the semiconductor layer, the ohmic contact being adjacent to the drain region and spaced away from the gate structure; and
forming a capacitance reducing structure adjacent to the drain region and in physical contact with an underside surface of the ohmic contact.

* * * * *